(12) United States Patent
Johnson et al.

(10) Patent No.: US 8,349,084 B2
(45) Date of Patent: Jan. 8, 2013

(54) APPARATUS AND SYSTEMS FOR INTERMIXING CADMIUM SULFIDE LAYERS AND CADMIUM TELLURIDE LAYERS FOR THIN FILM PHOTOVOLTAIC DEVICES

(75) Inventors: James Neil Johnson, Scotia, NY (US); Bastiaan Arie Korevaar, Schenectady, NY (US); Yu Zhao, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/080,029

(22) Filed: Apr. 5, 2011

(65) Prior Publication Data
US 2012/0103261 A1 May 3, 2012

Related U.S. Application Data

(62) Division of application No. 12/913,296, filed on Oct. 27, 2010, now Pat. No. 7,939,363.

(51) Int. Cl.
| | |
|---|---|
| C23C 16/54 | (2006.01) |
| C23C 16/455 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. ........ 118/718; 118/719; 118/726; 118/729; 156/345.33; 156/345.34; 156/345.54

(58) Field of Classification Search .................. 118/718, 118/719, 726, 729; 156/345.33, 345.34, 156/345.54
See application file for complete search history.

(56) References Cited

U.S. PATENT DOCUMENTS

| | | | |
|---|---|---|---|
| 3,805,736 A * | 4/1974 | Foehring et al. | 118/719 |
| 4,950,615 A | 8/1990 | Basol et al. | |
| 5,068,871 A * | 11/1991 | Uchida et al. | 373/17 |
| 5,221,556 A * | 6/1993 | Hawkins et al. | 427/255.17 |
| 5,248,349 A | 9/1993 | Foote et al. | |
| 5,261,968 A | 11/1993 | Jordan | |
| 5,372,646 A | 12/1994 | Foote et al. | |
| 5,413,671 A * | 5/1995 | Ketchum | 216/37 |
| 5,474,939 A | 12/1995 | Pollock et al. | |
| 5,772,715 A | 6/1998 | McMaster et al. | |
| 5,922,142 A | 7/1999 | Wu et al. | |
| 6,137,048 A | 10/2000 | Wu et al. | |

(Continued)

FOREIGN PATENT DOCUMENTS

EP         2034002         3/2009

(Continued)

*Primary Examiner* — Rudy Zervigon
(74) *Attorney, Agent, or Firm* — Dority & Manning, P.A.

(57) ABSTRACT

An apparatus for sequential deposition of an intermixed thin film layer and a sublimated source material on a photovoltaic (PV) module substrate is provided, along with associated processes. The process can include introducing a substrate into a deposition chamber, wherein a window layer (e.g., a cadmium sulfide layer) is on a surface of the substrate. A sulfur-containing gas can be supplied to the deposition chamber. In addition, a source vapor can be supplied to the deposition chamber, wherein the source material comprises cadmium telluride. The sulfur-containing gas and the source vapor can be present within the deposition chamber to form an intermixed layer on the window layer. In one particular embodiment, for example, the intermixed layer generally can have an increasing tellurium concentration and decreasing sulfur concentration extending away from the window layer.

18 Claims, 7 Drawing Sheets

U.S. PATENT DOCUMENTS

| | | |
|---|---|---|
| 6,169,246 B1 | 1/2001 | Wu et al. |
| 6,310,281 B1 | 10/2001 | Wendt et al. |
| 6,423,565 B1 | 7/2002 | Barth et al. |
| 6,444,043 B1 | 9/2002 | Gegenwart et al. |
| 6,453,992 B1 * | 9/2002 | Kim ............................ 165/206 |
| 6,548,751 B2 | 4/2003 | Sverdrup, Jr. et al. |
| 7,522,282 B2 | 4/2009 | Nolte et al. |
| 7,659,968 B2 | 2/2010 | Wang et al. |
| 7,663,092 B2 | 2/2010 | Nolte et al. |
| 2005/0009228 A1 | 1/2005 | Wu et al. |
| 2009/0194165 A1 | 8/2009 | Murphy et al. |
| 2009/0242029 A1 | 10/2009 | Paulson et al. |

FOREIGN PATENT DOCUMENTS

| | | |
|---|---|---|
| EP | 2110904 | 10/2009 |
| JP | 61006875 A * | 1/1986 |

* cited by examiner

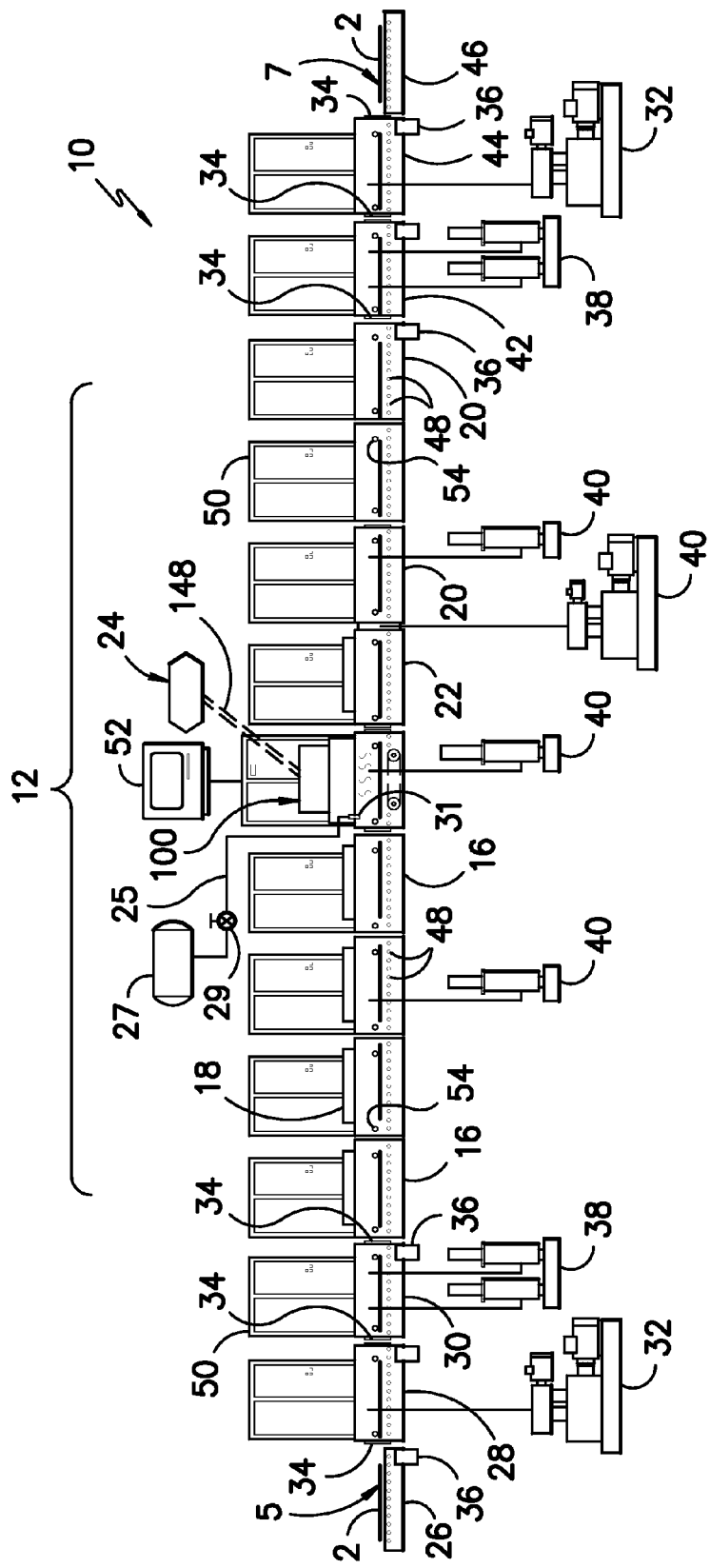
FIG. -4-

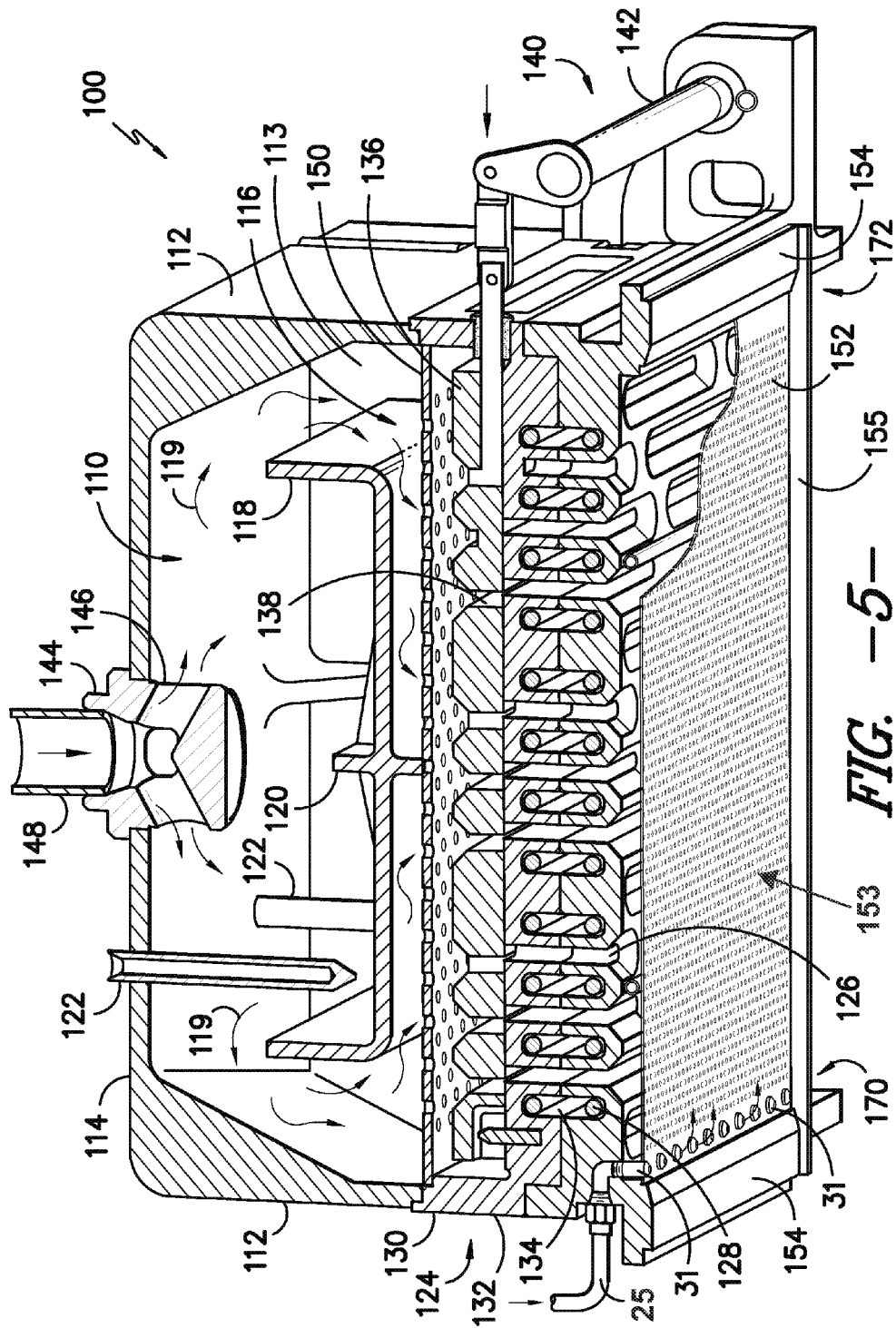
FIG. -5-

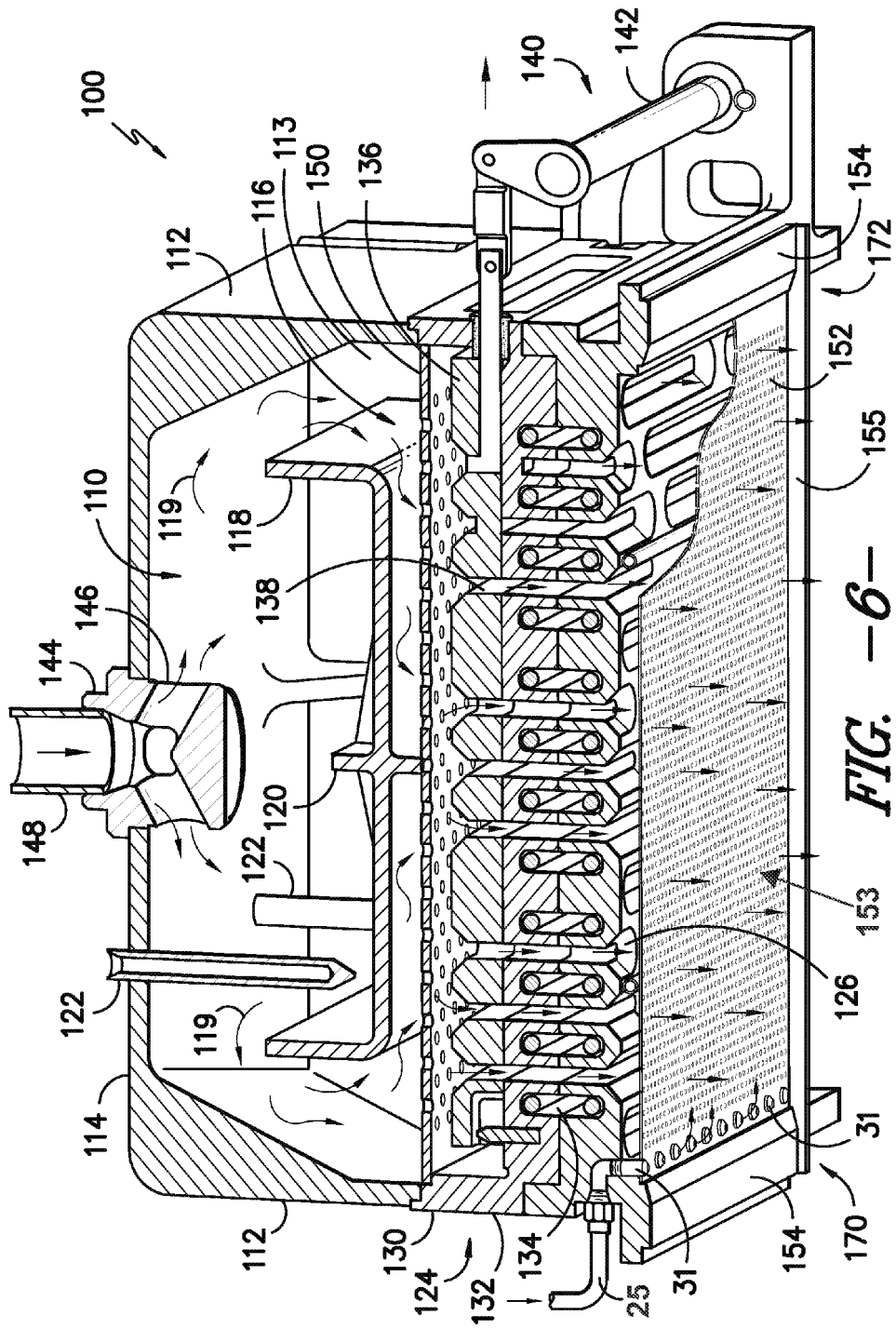

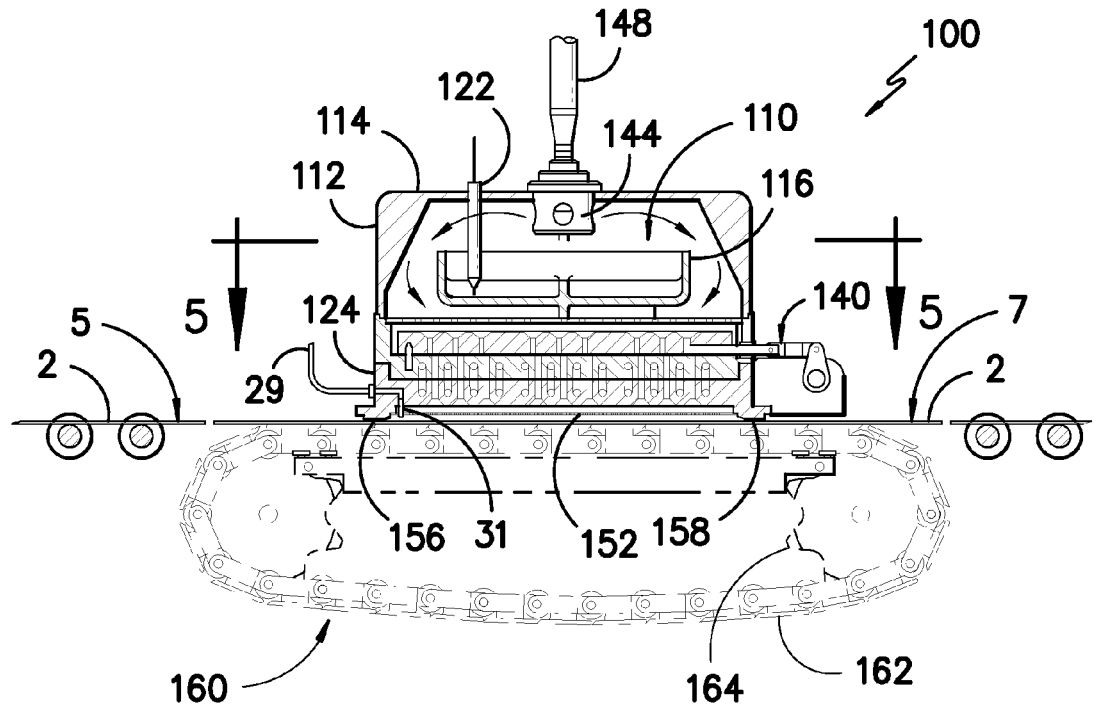
FIG. -7-
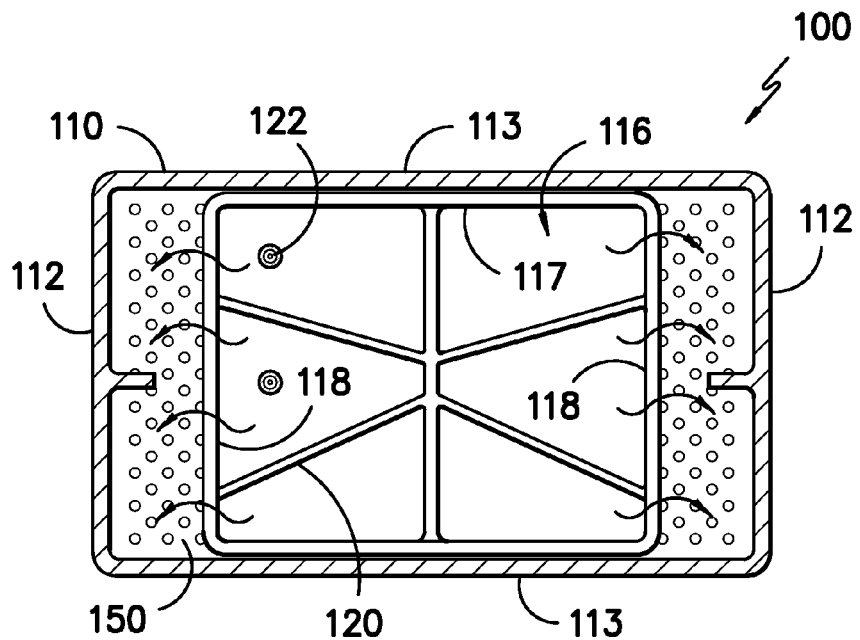
FIG. -8-

APPARATUS AND SYSTEMS FOR INTERMIXING CADMIUM SULFIDE LAYERS AND CADMIUM TELLURIDE LAYERS FOR THIN FILM PHOTOVOLTAIC DEVICES

PRIORITY INFORMATION

The present application claims priority to and is a divisional application of U.S. patent application Ser. No. 12/913,296 of Johnson, et al. filed on Oct. 27, 2010, and titled "Systems and Methods of Intermixing Cadmium Sulfide Layers and Cadmium Telluride Layers for Thin Film Photovoltaic Devices," which is incorporated by reference herein.

FIELD OF THE INVENTION

The subject matter disclosed herein relates generally to systems and methods of depositing intermixed thin film layers containing cadmium sulfide and cadmium telluride. More particularly, the subject matter disclosed herein relates to systems and methods of depositing intermixed thin film layers of cadmium sulfide and cadmium telluride for use in cadmium telluride thin film photovoltaic devices and their methods of manufacture.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert energy from the solar spectrum more efficiently as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer). Free carriers are created by light energy and then separated by the p-n heterojunction to produce an electrical current.

Intermixing at the surfaces of the cadmium sulfide and cadmium telluride layers can occur during the deposition process and the annealing process after deposition of the cadmium telluride layer. This intermixing can increase the minority carrier lifetime in the cadmium telluride, thereby increasing the open circuit voltage (Voc) and the fill factor, and therefore the efficiency of the device. However, intermixing caused by the annealing process is dependent upon several manufacturing variables including the annealing temperature, length of anneal, thin film and surface uniformity (especially at the p-n junction), dopant concentration(s), annealing atmosphere (e.g., humidity), etc. These manufacturing variables can create problems in forming substantially uniform PV devices during a large scale manufacturing process, resulting in varying efficiencies of the manufactured PV devices.

Thus, a need exists for cadmium telluride photovoltaic devices having improved p-n junctions defined by controlled intermixed layers of cadmium sulfide and cadmium telluride.

BRIEF DESCRIPTION OF THE INVENTION

Aspects and advantages of the invention will be set forth in part in the following description, or may be obvious from the description, or may be learned through practice of the invention.

A process is generally provided for manufacturing a cadmium telluride based thin film photovoltaic device having an intermixed layer. The process can include introducing a substrate into a deposition chamber, wherein a window layer (e.g., a cadmium sulfide layer) is on a surface of the substrate. A sulfur-containing gas can be supplied to the deposition chamber. In addition, a source vapor can be supplied to the deposition chamber, wherein the source material comprises cadmium telluride. The sulfur-containing gas and the source vapor can be present within the deposition chamber to form an intermixed layer on the window layer. In one particular embodiment, for example, the intermixed layer generally can have an increasing tellurium concentration and decreasing sulfur concentration extending away from the window layer.

An apparatus is also generally provided for sequential deposition of an intermixed thin film layer and a sublimated source material on a photovoltaic (PV) module substrate. The apparatus can include a distribution plate disposed between a supply of source vapors and a substrate conveyed through the apparatus. The distribution plate includes a pattern of passages therethrough that distribute the source vapors passing to the substrate. A gas supply system including a gas source tank connected to an exit port via a gas source line can also be included such that the exit port is positioned to supply a gas through the distribution plate to the deposition surface of the substrate conveyed through the apparatus.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 4 is a plan view of a system that may incorporate embodiments of a vapor deposition apparatus of the present invention;

FIG. 5 is a cross-sectional view of an embodiment of a vapor deposition apparatus according to aspects of the invention in a first operational configuration;

FIG. 6 is a cross-sectional view of the embodiment of FIG. 5 in a second operational configuration;

FIG. 7 is a cross-sectional view of the embodiment of FIG. 5 in cooperation with a substrate conveyor;

FIG. 8 is a top view of the receptacle component within the embodiment of FIG. 5; and, FIG. 9 shows a flow diagram of an exemplary method of manufacturing a photovoltaic module including a cadmium telluride thin film photovoltaic device.

Figure 1:
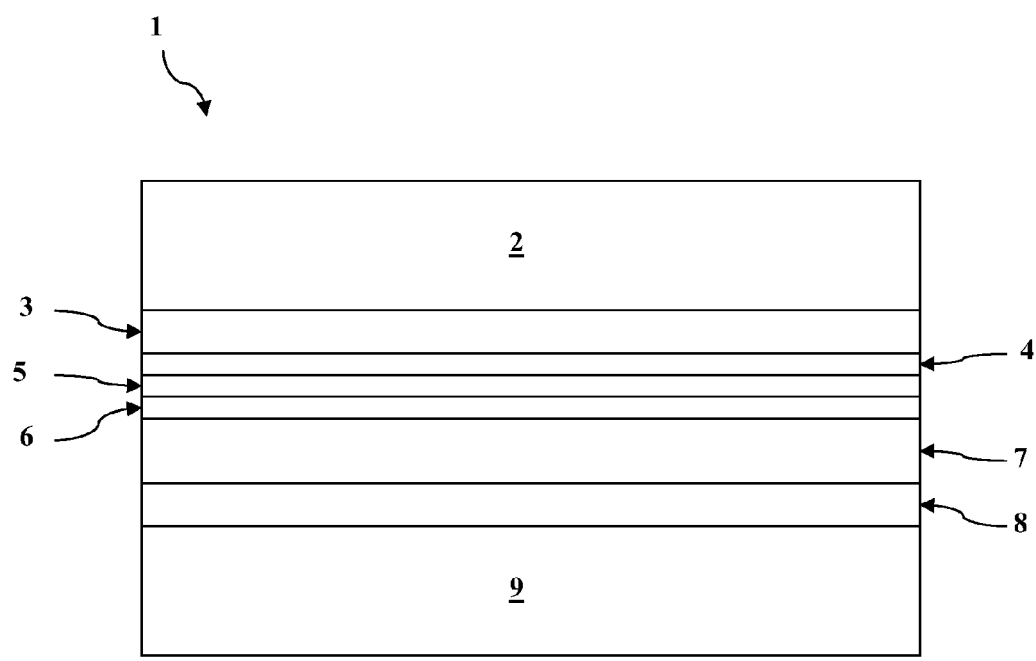
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., sub-ranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, systems and methods of manufacturing cadmium telluride thin film photovoltaic devices are presently disclosed having an intermixed layer of cadmium sulfide and cadmium telluride (CdTe/CdS). The intermixed layer of CdTe/CdS is positioned between a window layer and the cadmium telluride layer, and is formed during the deposition process, prior to annealing the cadmium telluride layer, to better control the stoichiometry of the junction of the window layer (e.g., a cadmium sulfide layer) and the cadmium telluride layer. Additionally, the uniformity of the junction formed in individual devices throughout the manufacturing process can be better controlled.

The intermixed layer of CdTe/CdS can generally have an increasing tellurium concentration and decreasing sulfur concentration extending from the window layer(s) towards the back contact layer, although several configurations can be utilized to form such an intermixed layer.

The thickness of the intermixed layer can be configured to adjust and tailor the interaction and/or electrical field between the window layer(s) and the cadmium telluride layer. In most embodiments, the intermixed layer of CdTe/CdS can have a thickness less than the thickness of the cadmium telluride layer. For example, the thickness of the intermixed layer of CdTe/CdS can be between about 0.01 μm and about 1 μm, for example between about 10 nm to about 500 nm or from about 50 nm to about 250 nm.

FIG. 1 represents an exemplary cadmium telluride thin film photovoltaic device 1 having an intermixed layer 6 of CdTe/CdS positioned between window layers 3, 4, and 5 and a cadmium telluride layer 7, and other layers as discussed in greater detail below. In the embodiment shown in FIG. 2, for example, the intermixed layer 6 of CdTe/CdS is defined by a single thin film layer that is graded to have an increasing tellurium concentration and decreasing sulfur concentration through the thickness of the intermixed layer 6 extending from the window layer 5 to the cadmium telluride layer 7. For example, the intermixed layer 6 of CdTe/CdS can be represented as a $CdS_{1-x}Te_x$ layer, where $0 \leq x \leq 1$, with increasing tellurium content (i.e., increasing the value of x) through the thickness of the intermixed layer 6 extending from the window layer 5 to the cadmium telluride layer 7. In one particular embodiment, the junction of the window layer 5 and the intermixed layer 6 is primarily CdS and substantially free from tellurium (i.e., $CdS_{1-x}Te_x$, where x is about 0), and the opposite surface of the intermixed layer 6, which contacts the cadmium telluride layer 7, is primarily CdTe and substantially free from sulfur (e.g., $CdS_{1-x}Te_x$, where x is about 1). As used herein, the term "substantially free" means no more than an insignificant trace amount present and encompasses completely free (e.g., 0 molar % up to 0.0001 molar %).

In one embodiment, the increasing tellurium concentration and decreasing sulfur concentration may be a linear change (i.e., a substantially constant rate of change) through the thickness of the graded intermixed layer 6 extending from the window layer 5 to the cadmium telluride layer 7. Alternatively, the rate of increasing tellurium concentration and decreasing sulfur concentration may be varied throughout the graded intermixed layer 6. For example, the rate of increasing tellurium concentration and decreasing sulfur concentration may be relatively slow (e.g., x increasing to about 0.25 or less, such as x increasing to about 0.05 to about 0.1) through the first half of the thickness, while the rate of increasing tellurium concentration and decreasing sulfur concentration may be relatively fast through the second half of the thickness. Conversely, the rate of increasing tellurium concentration and decreasing sulfur concentration may be relatively fast (e.g., x increasing to about 0.75 or more, such as x increasing to about 0.8 to about 0.9) through the first half of the thickness, while the rate of increasing tellurium concentration and decreasing sulfur concentration may be relatively slow through the second half of the thickness.

According to the presently disclosed methods of deposition, the intermixed layer can be formed after deposition of the window layer 5, prior to and/or during the deposition of the cadmium telluride layer 7. For example, a sulfur-containing gas can be introduced into the deposition atmosphere during deposition of the cadmium telluride layer 7.

The sulfur-containing gas can be any suitable sulfur containing material that is a gas at the deposition conditions (i.e., at the deposition temperature and deposition pressure) of the intermixed layer 6 and the cadmium telluride layer 7 and includes a sulfur atom(s). For example, the sulfur-containing gas can be a vapor of a liquid or solid sulfur-containing source material, which may be carried with a carrier gas (e.g., an inert gas such as argon). Suitable sulfur-containing gasses can include sulfur gas, hydrogen sulfide, carbon disulfide, sulfur tetrafluoride, sulfur hexafluoride, sulfur dichloride, disulfur dichloride, dimethyl sulfide, tetrasulfur tetranitride, alkane thiols, thioethers, or mixtures thereof. In one particular embodiment, the sulfur-containing gas can include chlorine, such as sulfur dichloride, disulfur dichloride, or mixtures thereof. Without wishing to be bound by any particular theory, it is believed that the use of a sulfur-containing gas that also includes chlorine can deposit both sulfur and chlorine atoms into the intermixed layer 6. This co-deposition into the intermixed layer 6 of sulfur and chlorine atoms can supplement and/or replace subsequent chloride treatment to the deposited cadmium telluride layer 7 (e.g., with cadmium chloride).

The intermixed layer 6 and the cadmium telluride layer 7 can be deposited by any suitable method, such as closed space sublimation, sputtering of a cadmium telluride target, vapor transport deposition, diffusion transport deposition, etc.

In one particular embodiment, the intermixed layer 6 and the cadmium telluride layer 7 can be deposited in a diffusion transport deposition chamber, such as shown in FIGS. 4 through 6. FIG. 4 illustrates an embodiment of a system 10 that may incorporate a vapor deposition apparatus 100 (FIGS. 5 and 6) in accordance with embodiments of the invention configured for deposition of an intermixed layer and a cadmium telluride thin film layer on a photovoltaic (PV) module substrate 2 (referred to hereafter as a "substrate"). It should be appreciated that the present vapor deposition apparatus 100 is not limited to use in the system 10 illustrated in FIG. 4, but may be incorporated into any suitable processing line configured for vapor deposition of a thin film layer onto a PV module substrate 2.

For reference and an understanding of an environment in which the vapor deposition apparatus 100 may be used, the system 10 of FIG. 4 is described below, followed by a detailed description of the apparatus 100.

Referring to FIG. 4, the exemplary system 10 includes a vacuum chamber 12 defined by a plurality of interconnected modules. Any combination of rough and fine vacuum pumps 40 may be configured with the modules to draw and maintain a vacuum within the chamber 12. The vacuum chamber 12 includes a plurality of heater modules 16 that define a pre-heat section of the vacuum chamber through which the substrates 2 are conveyed and heated to a desired temperature before being conveyed into the vapor deposition apparatus 100. Each of the modules 16 may include a plurality of independently controlled heaters 18, with the heaters defining a plurality of different heat zones. A particular heat zone may include more than one heater 18. For example, the heaters 18 can heat the substrates 2 to a deposition temperature prior to entering the vapor deposition apparatus 100, such as to a deposition temperature of about 350° C. to about 700° C., such as about 400° C. to about 650° C.

The vacuum chamber 12 also includes a plurality of interconnected cool-down modules 20 downstream of the vapor deposition apparatus 100. The cool-down modules 20 define a cool-down section within the vacuum chamber 12 through which the substrates 2 having the thin film of sublimated source material deposited thereon are conveyed and cooled at a controlled cool-down rate prior to the substrates 2 being removed from the system 10. Each of the modules 20 may include a forced cooling system wherein a cooling medium, such as chilled water, refrigerant, gas, or other medium, is pumped through cooling coils (not illustrated) configured with the modules 20.

In the illustrated embodiment of system 10, at least one post-heat module 22 is located immediately downstream of the vapor deposition apparatus 100 and upstream of the cool-down modules 20 in a conveyance direction of the substrates. The post-heat module 22 maintains a controlled heating profile of the substrate 2 until the entire substrate is moved out of the vapor deposition apparatus 100 to prevent damage to the substrate, such as warping or breaking caused by uncontrolled or drastic thermal stresses. If the leading section of the substrate 2 were allowed to cool at an excessive rate as it exited the apparatus 100, a potentially damaging temperature gradient would be generated longitudinally along the substrate 2. This condition could result in breaking, cracking, or warping of the substrate from thermal stress.

As diagrammatically illustrated in FIG. 4, a feed device 24 is configured with the vapor deposition apparatus 100 to supply source material, such as granular CdTe. The feed device 24 may take on various configurations within the scope and spirit of the invention, and functions to supply the source material without interrupting the continuous vapor deposition process within the apparatus 100 or conveyance of the substrates 2 through the apparatus 100.

Additionally, a gas source line 25 is attached to the vapor deposition apparatus 100 to supply a gas (e.g., a sulfur-containing gas) from gas tank 27. A gas valve 29 can be positioned within the gas source line 25 to control the rate of flow of the gas to the vapor deposition apparatus 100. As shown, the gas source line 25 can supply the gas to the vapor deposition apparatus 100 below the deposition plate 152 via exit ports 31. In this embodiment, the substrate 2 can be directly exposed to the source gas (e.g., a sulfur-containing gas) only as it enters the vapor deposition apparatus 100. Thus, the exposure time that the substrate 2 is subjected to the supply gas can be minimized to create only a relatively thin intermixed layer 6. Additionally, through its positioning in the vapor deposition apparatus 100, the substrate 2 is exposed to the supply gas prior to exposure to the vapor trails of the source material. (e.g., cadmium telluride). For instance, under the deposition plate 152, the source gas can have a greater vapor pressure under exit ports 31 (e.g., at the first end 170) than at the opposite, second end 172 of the deposition plate 152 in the vapor deposition apparatus 100.

As such, the substrates 2 can be exposed to a deposition atmosphere in the front of the vapor deposition apparatus 100 having a relatively high sulfur gas concentration (e.g., about 75% to 100% by volume) that decreases as the substrates move into the vapor deposition apparatus 100 for subsequent deposition of the cadmium telluride layer 7 through exposure to the cadmium telluride vapor passing through the deposition plate 152.

In practice, the partial pressure of the sulfur-containing gas supplied under the deposition plate 152 through exit ports 31 can form a pressure gradient within vapor deposition apparatus 100 under the deposition plate 152 that has a decreasing partial pressure of the sulfur-containing gas further from the exit ports 31. In particular, the partial pressure of the cadmium telluride vapor can increase substantially under the holes of the deposition plate 152 as the substrates 2 move from the first end 170 to the second end 172. Thus, the substrates 2 can be exposed to a decreasing concentration of the sulfur source and an increasing concentration of the cadmium telluride vapor as they move through the vapor deposition apparatus 100.

Figure 2:
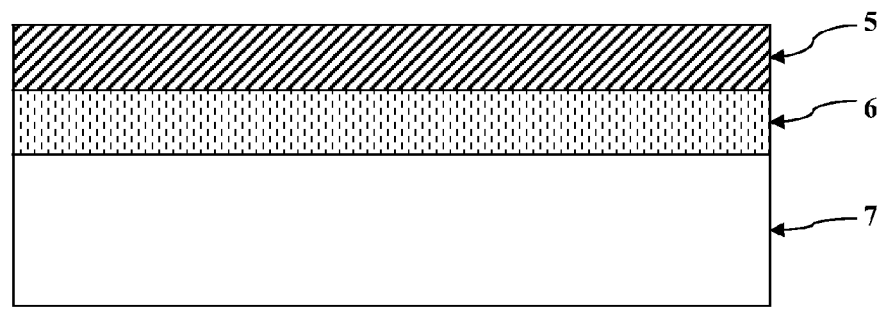
FIG. 2 shows an exemplary embodiment of an intermixed layer of cadmium sulfide and cadmium telluride defined by a single graded layer having increasing tellurium concentration and decreasing sulfur concentration through the thickness of the graded telluride layer extending from the window layer to the cadmium telluride layer.

Accordingly, a device 1 as shown in FIG. 2 can be formed having an intermixed layer 6 defining a gradient of decreasing sulfur concentration and increasing tellurium concentration extending through the thickness from the window layer 5 to the cadmium telluride layer 7. The rate of change of the decreasing sulfur concentration and increasing tellurium concentration can be controlled by varying the gas flow rate of the sulfur-containing gas through exit ports 31, the vapor flow rate of the cadmium telluride vapor through the holes of the deposition plate 152, and the linear travel rate of the substrates 2 passing under the exit ports 31 and the deposition plate 152.

For example, the flow rate of the sulfur-containing gas through the exit ports 31 can be controlled using valve 29 such that the partial pressure gradient of the sulfur-containing gas forms distinct zones within vapor deposition apparatus 100. As such, the embodiment shown in FIG. 3 can be formed where the intermixed layer 6 includes a plurality of intermixed layers of increasing cadmium tellurium content (layers 6.1 through 6.6, respectively) formed step-wise to collectively define the intermixed layer 6. Each individual layer 6.1 through 6.6 has an increasing tellurium content and decreasing sulfur content, relative to the prior deposited layer, such that layer 6.2 has more tellurium content and less sulfur content than layer 6.1, layer 6.3 has more tellurium content and less sulfur content than layer 6.2, layer 6.4 has more tellurium content and less sulfur content than layer 6.3, layer 6.5 has more tellurium content and less sulfur content than layer 6.4, and layer 6.6 has more tellurium content and less sulfur content than layer 6.5. For instance, layer 6.1 can have a structure of $CdS_{1-x}Te_x$, where $0<x\leq0.2$; layer 6.2 can have a structure of $CdS_{1-x}Te_x$, where $0.2\leq x\leq0.4$; layer 6.3 can have a structure of $CdS_{1-x}Te_x$, where $0.4\leq x\leq0.6$; layer 6.4 can have a structure of $CdS_{1-x}Te_x$, where $0.6\leq x\leq0.8$; layer 6.5 can have a structure of $CdS_{1-x}Te_x$, where $0.8\leq x<1$; and layer 6.6 can have a structure of $CdS_{1-x}Te_x$, where x is about 1. As such, in one particular embodiment, the junction of the window layer 5 and the layer 6.1 is primarily CdS (i.e., $CdS_{1-x}Te_x$, where x is 0), and the junction of the intermixed layer 6.6 and the cadmium telluride layer 7 is substantially free from sulfur (e.g., $CdS_{1-x}Te_x$, where x is 1). Although the exemplary step-wise intermixed layer 6 shown in FIG. 3 has six layers 6.1-6.6, any number of step-wise layers can be used to form the intermixed layer 6. For example, the intermixed layer can be formed, in one particular embodiment, from three intermixed layers: a first layer closest to the window layer, a second layer on the first layer, and a third layer on the second layer, wherein the first layer comprises $CdS_{1-x}Te_x$, where $0\leq x\leq0.1$; the second layer (e.g., a transition layer) comprises $CdS_{1-x}Te_x$, where $0.1\leq x\leq0.9$; and, the third layer comprises $CdS_{1-x}Te_x$, where $0.9\leq x\leq1$. In another embodiment, the intermixed layer can be defined as a bilayer, including a first layer closest to the window layer and comprising $CdS_{1-x}Te_x$, where $0\leq x\leq0.1$; and a second layer adjacent to the cadmium telluride layer and comprising $CdS_{1-x}Te_x$, where $0.9\leq x\leq1$.

Additionally, each of the layers 6.1-6.6 can be formed of varying thickness, such as from about 1 nm to about 250 nm in thickness. In certain embodiments, the thickness of each of the layers 6.1-6.6 can be from about 10 nm to about 100 nm, for example from about 10 nm to about 50 nm. In one embodiment, each of the layers 6.1-6.6 can have substantially the same thickness.

Figure 3:
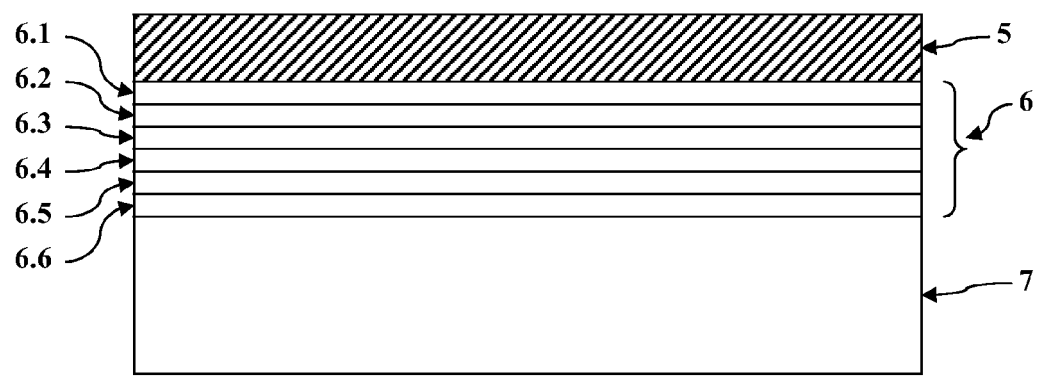
FIG. 3 shows another exemplary embodiment of an intermixed layer of cadmium sulfide and cadmium telluride formed step-wise such that a plurality of layers of increasing tellurium content and decreasing sulfur content define the intermixed layer.

The step-wise plurality of layers 6.1-6.6 can generally form the intermixed layer 6 upon annealing the device 1 (e.g., post-deposition of the cadmium telluride layer 7). For example, the device 1 can be annealed in the presence of cadmium chloride ($CdCl_2$), such as after deposition of the cadmium telluride layer 7. Annealing the device 1 can be performed by heating to an anneal temperature (e.g., about 150° C. to about 600° C.). In one embodiment, particularly when the intermixed layer 6 of CdTe/CdS is formed from a plurality of step-wise layers 6.1-6.6 as shown in FIG. 3, the cadmium telluride layer 7 and intermixed layer 6 of CdTe/CdS can be annealed less severely, such as at an anneal temperature of about 200° C. to about 450° C., such as about 350° C. to about 420° C., for less than about 60 minutes, such as from about 30 seconds to about 30 minutes. The formation of the plurality of layers 6.1-6.6 can allow for better control (e.g., stoichiometric control) of the intermixed layer 6 formed post anneal, rather than relying on the mixing of the window layer 5 and the cadmium telluride layer 7 at the junction surfaces.

However, other configurations can be utilized to supply a gas to the vapor deposition apparatus 100. For example, the gas source line 25 can supply gas to the vapor deposition apparatus 100 above the deposition plate 152.

In another embodiment, the sulfur-containing gas can be heated prior to entering the vapor deposition apparatus 100, such as within the gas source line 25. As shown, the sulfur-containing gas can be heated in a heating chamber (e.g., when vaporizing a liquid or gas sulfur source material) and/or within the gas source line 25 by passing through or nearby the heated distribution manifold 124. Additionally, a carrier gas (e.g., an inert gas like argon) can be utilized to control the flow of the sulfur-containing gas to the vapor deposition apparatus 100.

Still referring to FIG. 4, the individual substrates 2 are initially placed onto a load conveyor 26, and are subsequently moved into an entry vacuum lock station that includes a load module 28 and a buffer module 30. A "rough" (i.e., initial) vacuum pump 32 is configured with the load module 28 to drawn an initial vacuum, and a "fine" (i.e., final) vacuum pump 38 is configured with the buffer module 30 to increase the vacuum in the buffer module 30 to essentially the vacuum pressure within the vacuum chamber 12. Valves 34 (e.g., gate-type slit valves or rotary-type flapper valves) are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 2 into the vacuum chamber 12 in a step-wise manner without affecting the vacuum within the chamber 12.

In operation of the system 10, an operational vacuum is maintained in the vacuum chamber 12 by way of any combination of rough and/or fine vacuum pumps 40. In order to introduce a substrate 2 into the vacuum chamber 12, the load module 28 and buffer module 30 are initially vented (with the valve 34 between the two modules in the open position). The valve 34 between the buffer module 30 and the first heater module 16 is closed. The valve 34 between the load module 28 and load conveyor 26 is opened and a substrate 2 is moved into the load module 28. At this point, the first valve 34 is shut and the rough vacuum pump 32 then draws an initial vacuum in the load module 28 and buffer module 30. The substrate 2 is then conveyed into the buffer module 30, and the valve 34 between the load module 28 and buffer module 30 is closed. The fine vacuum pump 38 then increases the vacuum in the buffer module 30 to approximately the same vacuum in the vacuum chamber 12. At this point, the valve 34 between the buffer module 30 and vacuum chamber 12 is opened and the substrate 2 is conveyed into the first heater module 16.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and valves 34 are sequentially operated to move the substrates 2 out of the vacuum chamber 12 in a step-wise fashion without loss of vacuum condition within the vacuum chamber 12.

System 10 also includes a conveyor system configured to move the substrates 2 into, through, and out of the vacuum chamber 12. In the illustrated embodiment, this conveyor system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 2 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 4. The central system controller 52 can monitor and control (via the independent controllers 50) the functions of any one of the modules so as to achieve an overall desired heat-up rate, deposition rate, cool-down rate, conveyance rate, and so forth, in processing of the substrates 2 through the system 10.

Referring to FIG. 4, for independent control of the individual respective conveyors 48, each of the modules may include any manner of active or passive sensors 54 that detects the presence of the substrates 2 as they are conveyed through the module. The sensors 54 are in communication with the respective module controller 50, which is in turn in communication with the central controller 52. In this manner, the individual respective conveyor 48 may be controlled to ensure that a proper spacing between the substrates 2 is maintained and that the substrates 2 are conveyed at the desired conveyance rate through the vacuum chamber 12.

FIGS. 5 and 6 relate to a particular embodiment of the vapor deposition apparatus 100. Referring to FIGS. 5 and 6, the apparatus 100 includes a deposition head 110 defining an interior space in which a receptacle 116 is configured for receipt of a granular source material (not shown), such as cadmium telluride. As mentioned, the granular source material may be supplied by a feed device or system 24 via a feed tube 148 (FIG. 4). The feed tube 148 is connected to a distributor 144 disposed in an opening in a top wall 114 of the deposition head 110. The distributor 144 includes a plurality of discharge ports 146 that are configured to evenly distribute the granular source material into the receptacle 116. The receptacle 116 has an open top and may include any configuration of internal ribs 120 or other structural elements.

In the illustrated embodiment, at least one thermocouple 122 is operationally disposed through the top wall 114 of the deposition head 110 to monitor temperature within the deposition head 110 adjacent to or in the receptacle 116.

The deposition head 110 also includes longitudinal end walls 112 and side walls 113 (FIG. 8). Referring to FIG. 8 in particular, the receptacle 116 has a shape and configuration such that the transversely extending end walls 118 of the receptacle 116 are spaced from the end walls 112 of the head chamber 110. The longitudinally extending side walls 117 of the receptacle 116 lie adjacent to and in close proximity to the side walls 113 of the deposition head so that very little clearance exists between the respective walls, as depicted in FIG. 8. With this configuration, sublimated source material will flow out of the open top of the receptacle 116 and downwardly over the transverse end walls 118 forming a supply of source vapor 119 shown as leading and trailing curtains of vapor 119 over, as depicted by the flow lines in FIGS. 5-8. Very little of the sublimated source material 119 will flow over the side walls 117 of the receptacle 116. The curtains of vapor 119 are "transversely" oriented in that they extend across the transverse dimension of the deposition head 110, which is generally perpendicular to the conveyance direction of the substrates through the system.

A heated distribution manifold 124 is disposed below the receptacle 116. This distribution manifold 124 may take on various configurations within the scope and spirit of the invention, and serves to indirectly heat the receptacle 116, as well as to distribute the sublimated source material that flows from the receptacle 116. In the illustrated embodiment, the heated distribution manifold 124 has a clam-shell configuration that includes an upper shell member 130 and a lower shell member 132. Each of the shell members 130, 132 includes recesses therein that define cavities 134 when the shell members are mated together as depicted in FIGS. 2 and 3. Heater elements 128 are disposed within the cavities 134 and serve to heat the distribution manifold 124 to a degree sufficient for indirectly heating the source material within the receptacle 116 to cause sublimation of the source material. The heater elements 128 may be made of a material that reacts with the source material vapor and, in this regard, the shell members 130, 132 also serve to isolate the heater elements 128 from contact with the source material vapor. The heat generated by the distribution manifold 124 is also sufficient to prevent the sublimated source material from plating out onto components of the head chamber 110. Desirably, the coolest component in the head chamber 110 is the upper surface of the substrates 2 conveyed therethrough so as to ensure that the sublimated source material plates onto the substrate, and not onto components of the head chamber 110.

Still referring to FIGS. 5 and 6, the heated distribution manifold 124 includes a plurality of passages 126 defined therethrough. These passages have a shape and configuration so as to uniformly distribute the sublimated source material towards the underlying substrates 2 (FIG. 7).

In the illustrated embodiment, a distribution plate 152 is disposed below the distribution manifold 124 at a defined distance above a horizontal plane of the upper surface of an underlying substrate 2, as depicted in FIG. 7. This distance may be, for example, between about 0.3 cm to about 4.0 cm. In a particular embodiment, the distance is about 1.0 cm. The conveyance rate of the substrates below the distribution plate 152 may be in the range of, for example, about 10 mm/sec to about 40 mm/sec. In a particular embodiment, this rate may be, for example, about 20 mm/sec. The thickness of the CdTe film layer that forms onto the upper surface of the substrate 2 can vary within the scope and spirit of the invention, and may be, for example, between about 1 micron to about 5 microns. In a particular embodiment, the film thickness may be about 3 microns.

The distribution plate 152 includes a pattern of passages 153, such as holes, slits, and the like, therethrough that further distribute the sublimated source material passing through the distribution manifold 124 such that the source material vapors 119 are uninterrupted in the transverse direction. In other words, the pattern of passages 153 are shaped and staggered or otherwise positioned to ensure that the sublimated source material is deposited completely over the substrate in the transverse direction so that longitudinal streaks or stripes of "un-coated" regions on the substrate are avoided.

As previously mentioned, a significant portion of the sublimated source material will flow out of the receptacle 116 as leading and trailing curtains of vapor, as depicted in FIG. 8. Although these curtains of vapor will diffuse to some extent in the longitudinal direction prior to passing through the distribution plate 152, it should be appreciated that it is unlikely that a uniform distribution of the sublimated source material in the longitudinal direction will be achieved. In other words, more of the sublimated source material will be distributed through the longitudinal end sections of the distribution plate 152 as compared to the middle portion of the distribution plate. However, as discussed above, because the system 10 conveys the substrates 2 through the vapor deposition apparatus 100 at a constant (non-stop) linear speed, the upper surfaces of the substrates 2 will be exposed to the same deposition environment regardless of any non-uniformity of the vapor distribution along the longitudinal aspect of the apparatus 100. The passages 126 in the distribution manifold 124 and the holes in the distribution plate 152 ensure a relatively uniform distribution of the sublimated source material in the transverse aspect of the vapor deposition apparatus 100. So long as the uniform transverse aspect of the vapor is maintained, a relatively uniform thin film layer is deposited onto the upper surface of the substrates 2 regardless of any non-uniformity in the vapor deposition along the longitudinal aspect of the apparatus 100.

As illustrated in the figures, it may be desired to include a debris shield 150 between the receptacle 116 and the distribution manifold 124. This shield 150 includes holes defined therethrough (which may be larger or smaller than the size of the holes of the distribution plate 152) and primarily serves to retain any granular or particulate source material from passing through and potentially interfering with operation of the movable components of the distribution manifold 124, as discussed in greater detail below. In other words, the debris shield 150 can be configured to act as a breathable screen that inhibits the passage of particles without substantially interfering with vapors flowing through the shield 150.

Referring to FIGS. 5 through 7 in particular, apparatus 100 desirably includes transversely extending seals 154 at each longitudinal end of the head chamber 110. In the illustrated embodiment, the seals define an entry slot 156 and an exit slot 158 at the longitudinal ends of the head chamber 110. These seals 154 are disposed at a distance above the upper surface of the substrates 2 that is less than the distance between the surface of the substrates 2 and the distribution plate 152, as is depicted in FIG. 7. The seals 154 help to maintain the sublimated source material in the deposition area above the substrates. In other words, the seals 154 prevent the sublimated source material from "leaking out" through the longitudinal ends of the apparatus 100. It should be appreciated that the seals 154 may be defined by any suitable structure. In the illustrated embodiment, the seals 154 are actually defined by components of the lower shell member 132 of the heated distribution manifold 124. It should also be appreciated that the seals 154 may cooperate with other structure of the vapor deposition apparatus 100 to provide the sealing function. For example, the seals may engage against structure of the underlying conveyor assembly in the deposition area.

Any manner of longitudinally extending seal structure 155 may also be configured with the apparatus 100 to provide a seal along the longitudinal sides thereof. Referring to FIGS. 5 and 6, this seal structure 155 may include a longitudinally extending side member that is disposed generally as close as reasonably possible to the upper surface of the underlying convey surface so as to inhibit outward flow of the sublimated source material without frictionally engaging against the conveyor.

Referring to FIGS. 5 and 6, the illustrated embodiment includes a movable shutter plate 136 disposed above the distribution manifold 124. This shutter plate 136 includes a plurality of passages 138 defined therethrough that align with the passages 126 in the distribution manifold 124 in a first operational position of the shutter plate 136 as depicted in FIG. 6. As can be readily appreciated from FIG. 6, in this operational position of the shutter plate 136, the sublimated source material is free to flow through the shutter plate 136 and through the passages 126 in the distribution manifold 124 for subsequent distribution through the plate 152. Referring to FIG. 5, the shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110. Any suitable actuation mechanism, generally 140, may be configured for moving the shutter plate 136 between the first and second operational positions. In the illustrated embodiment, the actuation mechanism 140 includes a rod 142 and any manner of suitable linkage that connects the rod 142 to the shutter plate 136. The rod 142 is rotated by any manner of mechanism located externally of the head chamber 110.

The shutter plate 136 configuration illustrated in FIGS. 5 and 6 is particularly beneficial in that, for whatever reason, the sublimated source material can be quickly and easily contained within the head chamber 110 and prevented from passing through to the deposition area above the conveying unit. This may be desired, for example, during start up of the system 10 while the concentration of vapors within the head chamber builds to a sufficient degree to start the deposition process. Likewise, during shutdown of the system, it may be desired to maintain the sublimated source material within the head chamber 110 to prevent the material from condensing on the conveyor or other components of the apparatus 100.

Thus, through movement of the shutter plate 136, the rate that cadmium telluride vapor passes through the deposition plate 152 can be controlled as desired. As stated, this control of the flow rate of the cadmium telluride vapor can allow for tailoring of the intermixed layer 6 and the cadmium telluride layer 7 formed on the substrate 2, along with control of the gas flow rate of the sulfur-containing gas and the speed of the substrates 2 passing under the deposition plate 152.

Referring to FIG. 7, the vapor deposition apparatus 100 may further comprise a conveyor 160 disposed below the head chamber 110. This conveyor 160 may be uniquely configured for the deposition process as compared to the conveyors 48 discussed above with respect to the system 10 of FIG. 4. For example, the conveyor 160 may be a self-contained conveying unit that includes a continuous loop conveyor on which the substrates 2 are supported below the distribution plate 152. In the illustrated embodiment, the conveyor 160 is defined by a plurality of slats 162 that provide a flat, unbroken (i.e., no gaps between the slats) support surface for the substrates 2. The slat conveyor is driven in an endless loop around sprockets 164. It should be appreciated, however, that the invention is not limited to any particular type of conveyor 160 for moving the substrates 2 through the vapor deposition apparatus 100.

The present invention also encompasses various process embodiments for vapor deposition of the intermixed layer 6 and the cadmium telluride layer 7 to form a thin film on a PV module substrate. The various processes may be practiced with the system embodiments described above or by any other configuration of suitable system components. It should thus be appreciated that the process embodiments according to the invention are not limited to the system configuration described herein.

In a particular embodiment, the vapor deposition process includes supplying source material to a receptacle within a deposition head, and indirectly heating the receptacle with a heat source member to sublimate the source material. The sublimated source material is directed out of the receptacle and downwardly within the deposition head through the heat source member. Individual substrates are conveyed past a gas source exit port and then below the heat source member. The sublimated source material that passes through the heat source is distributed onto an upper surface of the substrates such that leading and trailing sections of the substrates in the direction of conveyance thereof are exposed to the same vapor deposition conditions so as to achieve a desired uniform thickness of the thin film layer on the upper surface of the substrates.

In yet another unique process embodiment, the passages for the sublimated source material through the heat source may be blocked with an externally actuated blocking mechanism, as discussed above. This embodiment may be particularly useful to control the flow of the sublimated source material to the substrates, allowing control of both the source gas (e.g., the sulfur-containing gas) and the source material vapor (e.g., the cadmium telluride vapor). Thus, the various partial pressures of both the sulfur-containing gas and the cadmium telluride vapor can be adjusted and controlled during the deposition process to provide precise thickness and stoichiometry of the deposited layers (e.g., the intermixed layer 6 and the cadmium telluride layer 7).

Desirably, the process embodiments include continuously conveying the substrates at a constant linear speed during the vapor deposition process.

As shown, the exemplary device 1 of FIG. 1 includes a top sheet of glass 2 employed as the substrate. In this embodiment, the glass 2 can be referred to as a "superstrate", as it is the substrate on which the subsequent layers are formed even though it faces upward to the radiation source (e.g., the sun) when the cadmium telluride thin film photovoltaic device 1 is in used. The top sheet of glass 2 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 2 can be a low iron float glass containing less than about 0.15% by weight iron (Fe), and may have a transmissiveness of about 0.9 or greater in the spectrum of interest (e.g., wavelengths from about 300 nm to about 900 nm).

Any suitable window layers 3, 4, and 5 can be included in the device 1. Additionally, although shown with three window layers in FIG. 1, the device 1 can include any suitable number of window layers. In one particular embodiment, the window layers 3, 4, and 5 can be a transparent conductive oxide layer 3, a resistive transparent buffer layer 4, and a cadmium sulfide layer 5, as discussed below. However, it is not intended that the window layer(s) be limited by the following discussion of one particular embodiment of the device 1.

A transparent conductive oxide (TCO) layer 3 is shown on the glass 2 of the exemplary device 1 of FIG. 1. The TCO layer 3 allows light to pass through with minimal absorption while also allowing electric current produced by the device 1 to travel sideways to opaque metal conductors (not shown). For instance, the TCO layer 3 can have a sheet resistance less than about 30 ohm per square, such as from about 4 ohm per square to about 20 ohm per square (e.g., from about 5 ohm per square to about 15 ohm per square). The TCO layer 3 generally includes at least one conductive oxide, such as tin oxide, zinc oxide, or indium tin oxide, or mixtures thereof. Additionally, the TCO layer 3 can include other conductive, transparent materials. The TCO layer 3 can also include zinc stannate and/or cadmium stannate.

The TCO layer 3 can be formed by sputtering, chemical vapor deposition, spray pyrolysis, or any other suitable deposition method. In one particular embodiment, the TCO layer 3 can be formed by sputtering (e.g., DC sputtering or RF sputtering) on the glass 2. For example, a cadmium stannate layer can be formed by sputtering a hot-pressed target containing stoichiometric amounts of $SnO_2$ and CdO onto the glass 2 in a ratio of about 1 to about 2. The cadmium stannate can alternatively be prepared by using cadmium acetate and tin (II) chloride precursors by spray pyrolysis.

In certain embodiments, the TCO layer 3 can have a thickness between about 0.1 μm and about 1 μm, for example from about 0.1 μm to about 0.6 μm, such as from about 0.2 μm to about 0.4 μm. Suitable flat glass substrates having a TCO layer 3 formed on the superstate surface can be purchased commercially from various glass manufactures and suppliers. For example, a particularly suitable glass 2 including a TCO layer 3 includes TEC 15 glass commercially available under the name TEC 15 TCO from Pilkington North America Inc. (Toledo, Ohio), which includes a TCO layer having a sheet resistance of 15 ohms per square.

A resistive transparent buffer layer 4 (RTB layer) is shown on the TCO layer 3 on the exemplary cadmium telluride thin film photovoltaic device 1 of FIG. 1. The RTB layer 4 is generally more resistive than the TCO layer 3 and can help protect the device 1 from chemical interactions between the TCO layer 3 and the subsequent layers during processing of the device 1. For example, in certain embodiments, the RTB layer 4 can have a sheet resistance that is greater than about 1000 ohms per square, such as from about 10 kOhms per square to about 1000 MOhms per square. The RTB layer 4 can also have a wide optical bandgap (e.g., greater than about 2.5 eV, such as from about 2.7 eV to about 3.5 eV).

Without wishing to be bound by a particular theory, it is believed that the presence of the RTB layer 4 can allow for a relatively thin window layer 5 (e.g., a cadmium sulfide layer 5 in this embodiment) to be included in the device 1 by reducing the possibility of interface defects (i.e., "pinholes" in the cadmium sulfide layer 5) creating shunts between the TCO layer 3 and the cadmium telluride layer 7. Thus, it is believed that the RTB layer 4 allows for improved adhesion and/or interaction between the TCO layer 3 and the cadmium telluride layer 7, thereby allowing a relatively thin cadmium sulfide layer 5 to be formed thereon without significant adverse effects that would otherwise result from such a relatively thin cadmium sulfide layer 5 formed directly on the TCO layer 3.

The RTB layer 4 can include, for instance, a combination of zinc oxide (ZnO) and tin oxide ($SnO_2$), which can be referred to as a zinc tin oxide layer ("ZTO"). In one particular embodiment, the RTB layer 4 can include more tin oxide than zinc oxide. For example, the RTB layer 4 can have a composition with a stoichiometric ratio of $ZnO/SnO_2$ between about 0.25 and about 3, such as in about an one to two (1:2) stoichiometric ratio of tin oxide to zinc oxide. The RTB layer 4 can be formed by sputtering, chemical vapor deposition, spray-pyrolysis, or any other suitable deposition method. In one particular embodiment, the RTB layer 4 can be formed by sputtering (e.g., DC sputtering or RF sputtering) on the TCO layer 3. For example, the RTB layer 4 can be deposited using a DC sputtering method by applying a DC current to a metallic source material (e.g., elemental zinc, elemental tin, or a mixture thereof) and sputtering the metallic source material onto the TCO layer 3 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 4 can have a thickness between about 0.075 µm and about 1 µm, for example from about 0.1 µm to about 0.5 µm. In particular embodiments, the RTB layer 4 can have a thickness between about 0.08 µm and about 0.2 µm.

A cadmium sulfide layer 5 is shown on RTB layer 4 of the exemplary device 1 of FIG. 1. The cadmium sulfide layer 5 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 5 can have a wide band gap (e.g., from about 2.25 eV to about 2.5 eV, such as about 2.4 eV) in order to allow most radiation energy (e.g., solar radiation) to pass. As such, the cadmium sulfide layer 5 is considered a transparent layer on the device 1.

The cadmium sulfide layer 5 can be formed by sputtering, chemical vapor deposition, chemical bath deposition, and other suitable deposition methods. In one particular embodiment, the cadmium sulfide layer 5 can be formed by sputtering (e.g., direct current (DC) sputtering or radio frequency (RF) sputtering) on the RTB layer 4. Sputtering deposition generally involves ejecting material from a target, which is the material source, and depositing the ejected material onto the substrate to form the film. DC sputtering generally involves applying a current to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the RTB layer 4, the cadmium sulfide layer 5 can have a thickness that is less than about 0.1 µm, such as between about 10 nm and about 100 nm, such as from about 50 nm to about 80 nm, with a minimal presence of pinholes between the TCO layer 3 and the cadmium sulfide layer 5. Additionally, a cadmium sulfide layer 5 having a thickness less than about 0.1 µm reduces any absorption of radiation energy by the cadmium sulfide layer 5, effectively increasing the amount of radiation energy reaching the underlying cadmium telluride layer 7.

The intermixed layer 6, as discussed above, is shown on the cadmium sulfide layer 5.

A cadmium telluride layer 7 is shown on the intermixed layer 6 in the exemplary cadmium telluride thin film photovoltaic device 1 of FIG. 1. The cadmium telluride layer 7 is a p-type layer that generally includes cadmium telluride (CdTe) but may also include other materials. As the p-type layer of device 1, the cadmium telluride layer 7 is the photovoltaic layer that interacts with the cadmium sulfide layer 5 (i.e., the n-type layer) to produce current from the adsorption of radiation energy by absorbing the majority of the radiation energy passing into the device 1 due to its high absorption coefficient and creating electron-hole pairs. For example, the cadmium telluride layer 7 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 7) across the junction to the n-type side (i.e., the cadmium sulfide layer 5) and, conversely, holes may pass from the n-type side to the p-type side.

The cadmium telluride layer 7 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 5 is deposited by a sputtering and the cadmium telluride layer 7 is deposited by vapor transport deposition as discussed above. In particular embodiments, the cadmium telluride layer 7 can have a thickness between about 0.1 µm and about 10 µm, such as from about 1 µm and about 5 µm (e.g., about 1 to about 2). In one particular embodiment, the cadmium telluride layer 7 can have a thickness between about 1.5 µm and about 4 µm, such as about 2 µm to about 3 µm.

A series of post-forming treatments can be applied to the exposed surface of the cadmium telluride layer 7. These treatments can tailor the functionality of the cadmium telluride layer 7 and prepare its surface for subsequent adhesion to the back contact layer(s) 22. For example, the cadmium telluride layer 7 can be annealed at elevated temperatures (e.g., from about 350° C. to about 500° C., such as from about 375° C. to about 425° C.) for a sufficient time (e.g., from about 1 to about 40 minutes) to create a quality p-type layer of cadmium telluride. Without wishing to be bound by theory, it is believed that annealing the cadmium telluride layer 7 (and the device 1) decreases the deep-defect density and makes the CdTe layer more p-type. Additionally, the cadmium telluride layer 7 can recrystallize and undergo grain regrowth during annealing.

Annealing the cadmium telluride layer 7 can be carried out in the presence of cadmium chloride in order to dope the cadmium telluride layer 7 with chloride ions. For example, the cadmium telluride layer 7 can be washed with an aqueous solution containing cadmium chloride then annealed at the elevated temperature.

In one particular embodiment, after annealing the cadmium telluride layer 7 in the presence of cadmium chloride, the surface can be washed to remove any cadmium oxide formed on the surface. This surface preparation can leave a Te-rich surface on the cadmium telluride layer 7 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 7. Along with a suitable etch, the addition of copper to the cadmium telluride layer 7 can form a surface of copper-telluride on the cadmium telluride layer 7 in order to obtain a low-resistance electrical contact between the cadmium telluride layer 7 (i.e., the p-type layer) and the back contact layer (s). Specifically, the addition of copper can create a surface layer of cuprous telluride ($Cu_2Te$) between the cadmium telluride layer 7 and the back contact layer 8 and/or can create a Cu-doped CdTe layer. Thus, the Te-rich surface of the cadmium telluride layer 7 can enhance the collection of current created by the device through lower resistivity between the cadmium telluride layer 7 and the back contact layer 8.

Copper can be applied to the exposed surface of the cadmium telluride layer 7 by any process. For example, copper can be sprayed or washed on the surface of the cadmium telluride layer 7 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 7, such as from about 125° C. to about 300° C. (e.g. from about 150° C. to about 250° C.) for about 5 minutes to about 30 minutes, such as from about 10 to about 25 minutes.

A back contact layer 8 is shown on the cadmium telluride layer 7. The back contact layer 8 generally serves as the back electrical contact, in relation to the opposite, TCO layer 3 serving as the front electrical contact. The back contact layer 8 can be formed on, and in one embodiment is in direct contact with, the cadmium telluride layer 7. The back contact layer 8 is suitably made from one or more highly conductive materials, such as elemental nickel, chromium, copper, tin, gold, or alloys or mixtures thereof. Additionally, the back contact layer 8 can be a single layer or can be a plurality of layers. In one particular embodiment, the back contact layer 8 can include graphite, such as a layer of carbon deposited on the p-layer followed by one or more layers of metal, such as the metals described above. The back contact layer 8, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 8, can be from about 0.1 µm to about 1.5 µm in thickness.

The encapsulating glass 9 is also shown in the exemplary cadmium telluride thin film photovoltaic device 1 of FIG. 1.

Other components (not shown) can be included in the exemplary device 1, such as buss bars, external wiring, laser etches, etc. For example, when the device 1 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 9:
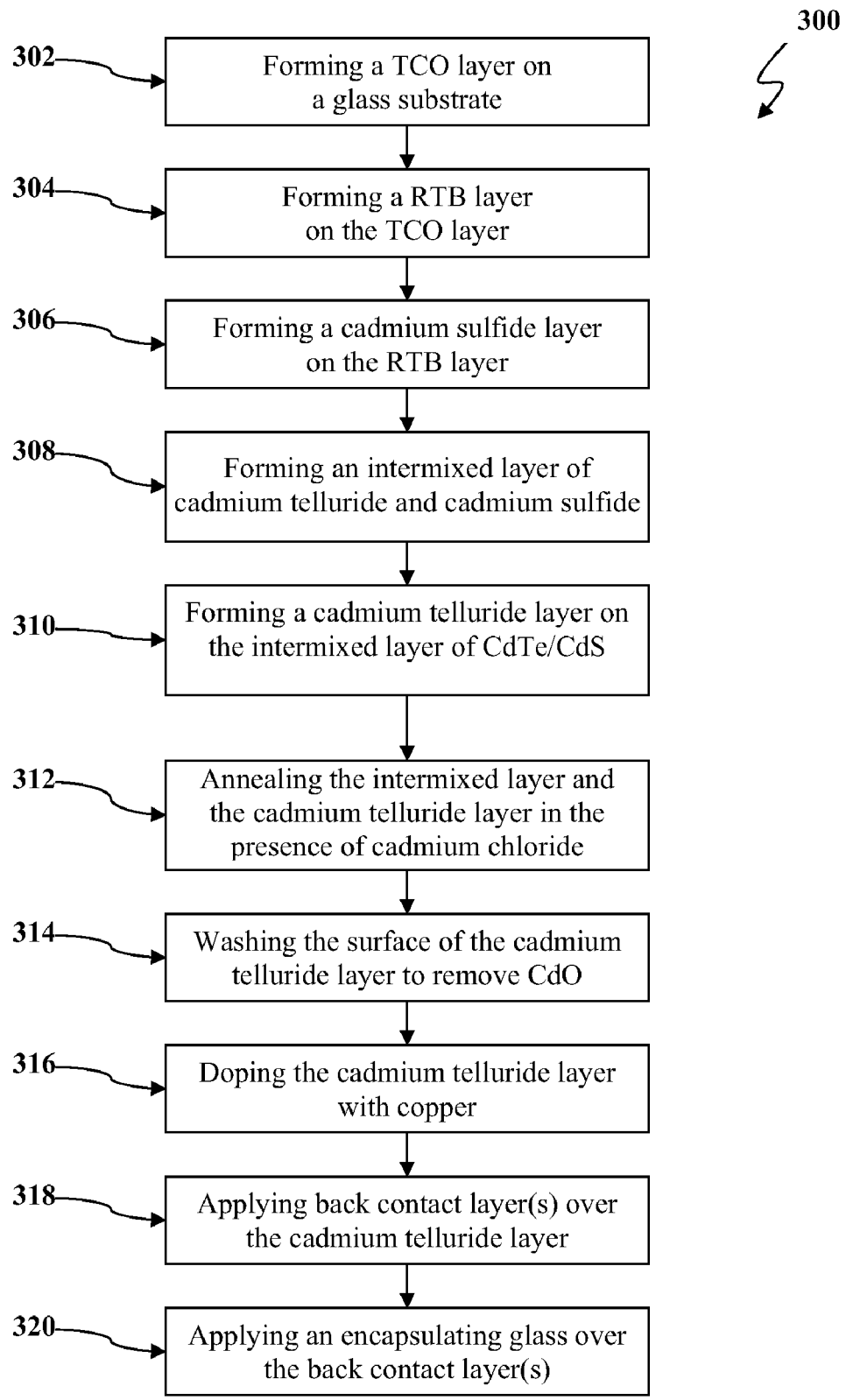

FIG. 9 shows a flow diagram of an exemplary method 300 of manufacturing a photovoltaic device according to one embodiment of the present invention. According to the exemplary method 300, a TCO layer is formed on a glass substrate at 302. At 304, a RTB layer is formed on the TCO layer. A window layer is formed on the RTB layer at 306. An intermixed layer of cadmium telluride and cadmium sulfide can then be formed on the window layer at 308. A cadmium telluride layer can then be formed on the intermixed layer at 310. The cadmium telluride layer and the intermixed layer can be annealed in the presence of cadmium chloride at 312. The cadmium telluride layer can then be washed at 314 to remove any CdO formed on the surface, and doped with copper at 316. At 318, back contact layer(s) can be applied over the cadmium telluride layer, and an encapsulating glass can be applied over the back contact layer at 320.

One of ordinary skill in the art should recognize that other processing and/or treatments can be included in the method 300. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:
1. A vapor deposition apparatus, said apparatus comprising:
   a deposition head;
   a receptacle disposed in said deposition head, said receptacle configured for receipt of a granular source material;

a distribution plate disposed between a supply of source vapor and a substrate conveyed through the apparatus, said distribution plate comprising a plurality of passages therethrough;

a conveyor disposed below said deposition plate such that the substrates are supported below said distribution plate, wherein said conveyor is configured to convey the substrates at a constant linear speed through said apparatus between an entry slot and an exit slot such that leading and trailing sections of the substrates are exposed to generally the same vapor deposition conditions within said deposition head in a direction of conveyance of the substrates through said apparatus; and, a gas tank connected to an exit port via a gas source line, wherein the exit port is positioned to supply a gas through the distribution plate to a deposition surface of the substrate conveyed through said apparatus on said conveyor, wherein upon heating the granular source material, source material vapors are created to pass through the distribution plate to the substrate.

2. The apparatus as in claim 1, wherein the exit port extends only through one end of the distribution plate.

3. The apparatus as in claim 1 further comprising a valve positioned within the gas source line for controlling the flow of the gas through the gas source line.

4. The apparatus as in claim 1, wherein the gas source line is connected to a plurality of exit ports.

5. The apparatus as in claim 4, wherein each of the exit ports extends only through one end of the distribution plate.

6. An apparatus for vapor deposition of a sublimated source material as a thin film on a photovoltaic module substrate, said apparatus comprising:

a deposition head;

a receptacle disposed in said deposition head, said receptacle configured for receipt of a granular source material;

a heated distribution manifold disposed below said receptacle, said distribution manifold comprising a plurality of passages defined therethrough, said distribution manifold configured to indirectly heat said receptacle to a degree sufficient to sublimate source material within said receptacle;

a distribution plate disposed below said distribution manifold and at a defined distance above a horizontal conveyance plane of an upper surface of a substrate conveyed through said apparatus, said distribution plate comprising a plurality of passages therethrough;

a transversely extending seal at each longitudinal end of said deposition head, said seals defining an entry and exit slot for a substrate conveyed through said apparatus, said seals disposed at a distance above the surface of the substrate that is less than the distance between the surface of the substrate and said distribution plate; and, a gas tank connected to an exit port via a gas source line, wherein the exit port is positioned to supply a gas through the distribution plate to a deposition surface of the substrate conveyed through said apparatus.

7. The apparatus as in claim 6, wherein the exit port extends only through one end of the distribution plate.

8. The apparatus as in claim 6 further comprising a valve positioned within the gas source line for controlling the flow of the gas through the gas source line.

9. The apparatus as in claim 6, wherein the gas source line is connected to a plurality of exit ports.

10. The apparatus as in claim 9, wherein each of the exit ports extends only through one end of the distribution plate.

11. The apparatus as in claim 6, wherein said receptacle comprises transversely extending end walls and longitudinally extending side walls, said end walls spaced from said deposition head a distance such that the sublimated source material flows primarily as transversely extending leading and trailing curtains over said end walls and downwardly through said distribution manifold.

12. The apparatus as in claim 11, wherein said passages in said distribution plate are in a pattern such that flow of the sublimated source material from said distribution manifold is uninterrupted across said distribution plate transverse to a conveyance direction of the substrate through said apparatus.

13. The apparatus as in claim 6, wherein a plurality of exit ports are positioned between one seal and the pattern of passages in the deposition plate.

14. The apparatus as in claim 6, wherein said distribution manifold comprises internal heating elements arranged between said passages in said manifold.

15. The apparatus as in claim 6, further comprising a debris shield disposed between said distribution manifold and said receptacle.

16. The apparatus as in claim 6, further comprising a conveyor disposed below said deposition head, said conveyor comprising a continuous loop conveyor on which the substrates are supported below said distribution plate, said conveyor configured to convey the substrates at a constant linear speed through said apparatus between an entry slot and an exit slot such that leading and trailing sections of the substrates are exposed to generally the same vapor deposition conditions within said deposition head in a direction of conveyance of the substrates through said apparatus.

17. An apparatus for vapor deposition of a sublimated source material as a thin film on a photovoltaic module substrate, said apparatus comprising:

a deposition head;

a receptacle disposed in said deposition head, said receptacle configured for receipt of a source material;

a distribution plate disposed below said distribution manifold and at a defined distance above a horizontal conveyance plane of an upper surface of a substrate conveyed through said apparatus, said distribution plate comprising a pattern of passages therethrough that distribute sublimated source material upon heating the source material in the receptacle;

a conveyor disposed below said deposition head, said conveyor comprising a continuous loop conveyor on which the substrates are supported below said distribution plate, said conveyor configured to convey the substrates at a constant linear speed through said apparatus between an entry slot and an exit slot such that leading and trailing sections of the substrates are exposed to generally the same vapor deposition conditions within said deposition head in a direction of conveyance of the substrates through said apparatus; and, a gas tank connected to an exit port via a gas source line, wherein the exit port is positioned to supply a gas through the distribution plate to a deposition surface of the substrate conveyed through said apparatus on said conveyor.

18. The apparatus as in claim 17, wherein the gas source line is connected to a plurality of exit ports.

* * * * *